(12) United States Patent
Wang

(10) Patent No.: US 11,404,577 B2
(45) Date of Patent: Aug. 2, 2022

(54) SEMICONDUCTOR DEVICE AND METHOD OF FORMING DOPED CHANNEL THEREOF

(71) Applicant: TAIWAN SEMICONDUCTOR MANUFACTURING CO., LTD., Hsinchu (TW)

(72) Inventor: Tai-Yuan Wang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 133 days.

(21) Appl. No.: 16/927,375

(22) Filed: Jul. 13, 2020

(65) Prior Publication Data

US 2020/0350436 A1 Nov. 5, 2020

Related U.S. Application Data

(62) Division of application No. 15/378,175, filed on Dec. 14, 2016, now Pat. No. 10,714,621.

(51) Int. Cl.
*H01L 29/10* (2006.01)
*H01L 29/78* (2006.01)
*H01L 29/423* (2006.01)
*H01L 29/66* (2006.01)
*H01L 29/165* (2006.01)

(52) U.S. Cl.
CPC ...... *H01L 29/7854* (2013.01); *H01L 29/1041* (2013.01); *H01L 29/42376* (2013.01); *H01L 29/66545* (2013.01); *H01L 29/7851* (2013.01); *H01L 29/165* (2013.01); *H01L 29/7848* (2013.01)

(58) Field of Classification Search
CPC ............ H01L 29/7854; H01L 29/1041; H01L 29/42376; H01L 29/66545; H01L 29/7851; H01L 29/165; H01L 29/7848; H01L 21/28114; H01L 29/66553
See application file for complete search history.

(56) References Cited

U.S. PATENT DOCUMENTS

| | | |
|---|---|---|
| 5,869,374 A | 2/1999 | Wu |
| 5,960,270 A | 9/1999 | Misra et al. |
| 6,025,635 A * | 2/2000 | Krivokapic ....... H01L 21/28114 257/288 |
| 6,278,164 B1 | 8/2001 | Hieda et al. |
| 6,383,884 B1 | 5/2002 | Shiozawa et al. |
| 6,479,356 B1 * | 11/2002 | Matsuoka ......... H01L 29/66583 438/289 |
| 6,482,724 B1 * | 11/2002 | Chatterjee ......... H01L 21/26586 257/244 |
| 6,562,687 B1 * | 5/2003 | Deleonibus ....... H01L 21/28035 257/E21.197 |
| 6,998,318 B2 | 2/2006 | Park |

(Continued)

*Primary Examiner* — Bitew A Dinke
(74) *Attorney, Agent, or Firm* — Birch, Stewart, Kolasch & Birch, LLP

(57) ABSTRACT

A method includes forming a dielectric cap over a semiconductor substrate; forming a dummy gate structure over the dielectric cap; forming gate spacers on opposite sidewalls of the dummy gate structure and on a top surface of the dielectric cap; removing the dummy gate structure to form a gate trench between the gate spacers and exposing the dielectric cap; and performing an ion implantation to form a doped region in the semiconductor substrate through the dielectric cap.

20 Claims, 12 Drawing Sheets

(56) References Cited

U.S. PATENT DOCUMENTS

| | | |
|---|---|---|
| 2001/0004542 A1* | 6/2001 | Woerlee ............ H01L 21/76895 438/291 |
| 2001/0055842 A1 | 12/2001 | Uh et al. |
| 2002/0058372 A1 | 5/2002 | Jang et al. |
| 2002/0142529 A1 | 10/2002 | Matsuda et al. |
| 2002/0179980 A1 | 12/2002 | Yagishita et al. |
| 2003/0162358 A1 | 8/2003 | Hanafi et al. |
| 2003/0235990 A1 | 12/2003 | Wu |
| 2005/0087802 A1* | 4/2005 | Park .................. H01L 29/66553 257/335 |
| 2006/0001095 A1 | 1/2006 | Doris et al. |
| 2006/0008973 A1* | 1/2006 | Phua ................ H01L 21/82385 438/231 |
| 2006/0091473 A1 | 5/2006 | Watanabe et al. |
| 2010/0038705 A1* | 2/2010 | Doris ................ H01L 21/28026 257/327 |
| 2011/0033996 A1* | 2/2011 | Deleonibus ........... H01L 29/513 438/287 |
| 2011/0248358 A1 | 10/2011 | Yin et al. |
| 2011/0303951 A1* | 12/2011 | Zhu .................. H01L 29/66545 257/192 |
| 2012/0112249 A1 | 5/2012 | Yin et al. |
| 2013/0109145 A1* | 5/2013 | Mieno ............... H01L 29/66537 438/305 |
| 2014/0061792 A1* | 3/2014 | Bu .................... H01L 29/66795 257/347 |
| 2014/0110798 A1* | 4/2014 | Cai .................... H01L 29/4966 257/410 |
| 2015/0132907 A1 | 5/2015 | Renau et al. |
| 2015/0243526 A1* | 8/2015 | Hsiao ................ H01L 29/6656 438/289 |
| 2015/0263128 A1* | 9/2015 | Basker ............... H01L 29/0847 257/288 |
| 2016/0172248 A1* | 6/2016 | Peng ............... H01L 21/823412 438/275 |
| 2016/0204215 A1* | 7/2016 | Chang ............ H01L 21/823821 257/401 |
| 2016/0240650 A1* | 8/2016 | Chang ............... H01L 29/66795 |
| 2017/0005191 A1* | 1/2017 | Wu ..................... H01L 29/0653 |
| 2018/0006162 A1* | 1/2018 | Zhou .................. H01L 29/1079 |

\* cited by examiner

SEMICONDUCTOR DEVICE AND METHOD OF FORMING DOPED CHANNEL THEREOF

PRIORITY CLAIM AND CROSS-REFERENCE

The present application is a Divisional application of U.S. application Ser. No. 15/378,175, filed on Dec. 14, 2016, now U.S. Pat. No. 10,714,621, issued on Jul. 14, 2020, which is herein incorporated by reference.

BACKGROUND

Semiconductor devices are used in a large number of electronic devices. Semiconductor devices comprise integrated circuits that are formed on semiconductor wafers by depositing thin films of material over the semiconductor wafers, and patterning the thin films of material to form the integrated circuits. Integrated circuits include field-effect transistors (FETs) such as metal oxide semiconductor (MOS) transistors. One of goals of the semiconductor industry is to continue shrinking the size and increasing the speed of individual FETs. To achieve these goals, fin FETs (FinFETs) or multiple gate transistors are employed. FinFETs not only improve area density, but also improve gate control of the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
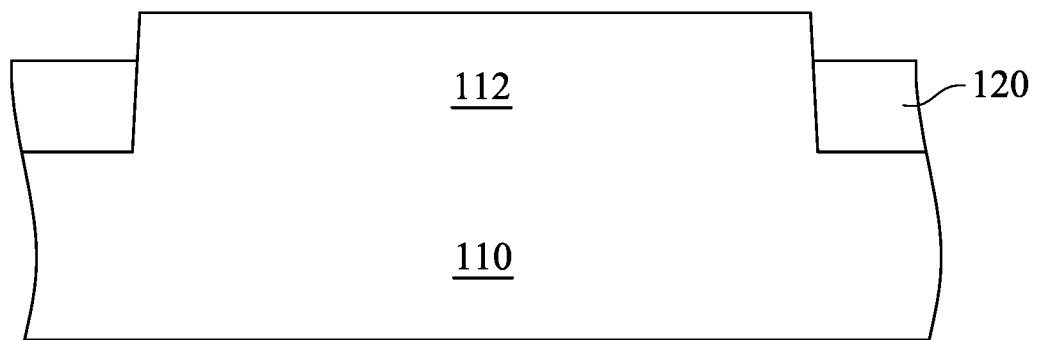
FIG. 1 to FIG. 12 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 12 illustrate a method for manufacturing a semiconductor device at various stages in accordance with some embodiments of the present disclosure. Reference is made to FIG. 1. Substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Semiconductor fin 112 is formed on the substrate 110. In some embodiments, the semiconductor fin 112 includes silicon. The semiconductor fin 112 may be formed, for example, by patterning and etching the substrate 110 using photolithography techniques, such that the semiconductor fin 112 protrudes from the substrate 110. For example, a layer of photoresist material (not shown) is deposited over the substrate 110. The layer of photoresist material is irradiated (exposed) in accordance with a predetermined pattern (the semiconductor fin 112 in this case) and developed to remove portions of the photoresist material. The remaining photoresist material protects the underlying material from subsequent processing steps, such as etching. It is noted that other masks, such as an oxide or silicon nitride mask, may also be used in the etching process. In some embodiments, plural semiconductor fins 112 are formed on the substrate 110.

An isolation dielectric 120 is formed to fill trenches between the semiconductor fins 112 as shallow trench isolation (STI). The isolation dielectric 120 may include any suitable dielectric material, such as silicon oxide, silicon nitride, the like, or combinations thereof. The method of forming the isolation dielectric 120 may include depositing an isolation dielectric 120 on the substrate 110 to cover the semiconductor fins 112, optionally performing a planarization process to remove the excess isolation dielectric 120 outside the trenches, and then performing an etching process on the isolation dielectric 120 until upper portions of the semiconductor fins 112 are exposed. The isolation dielectric 120 may be deposited using a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used.

It is understood that the processes described above are some examples of how semiconductor fins 112 may be formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor fin 112 can be recessed, and a material different from the semiconductor fin 112 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments, the semiconductor fin 112 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 2:
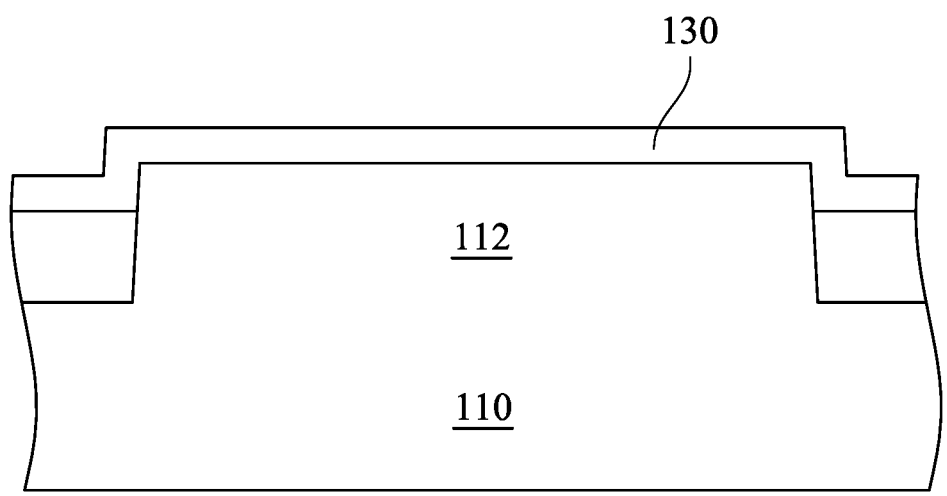

Reference is made to FIG. 2. A dielectric cap layer 130 is blanket formed on the structure shown in FIG. 1, so that the dielectric cap layer 130 at least caps the semiconductor fin 112. The dielectric cap layer 130 may be used for implantation screening and reduction of the channeling effect during the subsequent implantation. The dielectric cap layer 130 may be an oxide layer, ranging from about 2 nm to about 6 nm in thickness, as examples. Formation of the oxide layer 130 may be exemplarily achieved by deposition, such as CVD or physical vapor deposition (PVD).

Figure 3:
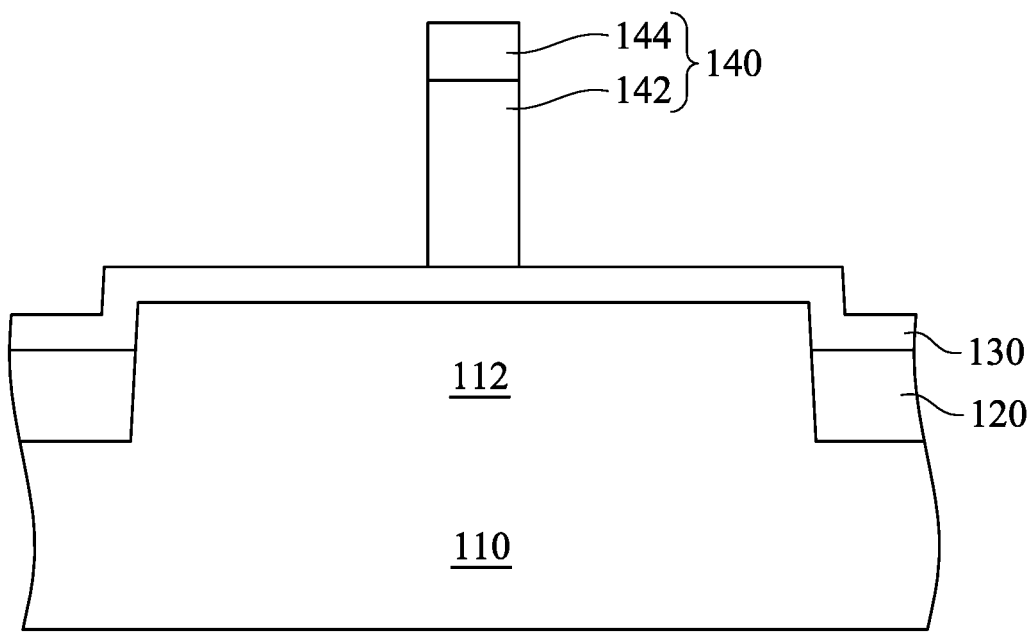

Reference is made to FIG. 3. Gate structure 140 is formed on the dielectric cap layer 130. The gate structure 140 includes a gate electrode 142 with a mask layer 144 over the gate electrode 142. A central portion of the semiconductor fin 112 can be wrapped by the gate structure 140. The gate structure 140 has a longitudinal axis substantially perpendicular to that of the semiconductor fin 112. Moreover, the gate structure 140 may cross over a plurality of substantially parallel semiconductor fins 112. In some embodiments, the gate structure 140 is a dummy gate structure and will be replaced with a replacement gate structure using a "gate-last" or replacement-gate process. In other embodiments, the gate structure 140 is an active gate and is formed in a "gate-first process" and will not be replaced.

The gate electrode 142 is formed by first forming a blanket gate electrode layer (not shown) over the dielectric cap layer 130 and then patterning the gate electrode layer to form the gate electrode 142. In some embodiments, the gate electrode layer may include polycrystalline-silicon (poly-Si), poly-crystalline silicon-germanium (poly-SiGe), metallic nitrides, metallic silicides, metallic oxides, or metals. In some embodiments, the gate electrode layer includes a metal-containing material such as TiN, TaN, TaC, Co, Ru, Al, combinations thereof, or multi-layers thereof. The gate electrode layers may be deposited by CVD, physical vapor deposition (PVD), sputter deposition, or other techniques suitable for depositing conductive materials. The mask layer 144, such as photoresist, hard mask, combinations thereof, or multi-layers thereof, may be formed and patterned over the gate electrode layer. Pattern of the patterned mask layer 144 may then be transferred to the material of the gate electrode layer using acceptable photolithography and etching techniques to form the gate electrode 142.

Figure 4:
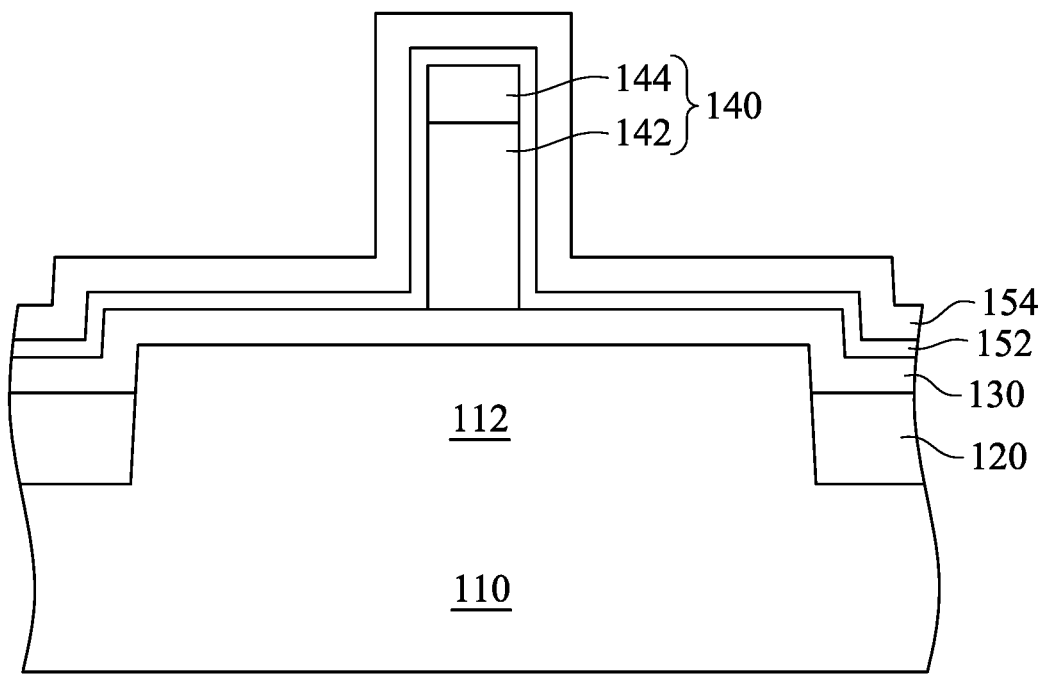

Reference is made to FIG. 4. First dielectric layer 152 is blanket formed on the structure shown in FIG. 3, and second dielectric layer 154 is then formed on the first dielectric layer 152. The first dielectric layer 152 and the dielectric cap layer 130 may have substantially the same material. Therefore, the first dielectric layer 152 can act as a sacrificial layer during subsequent removal of the dielectric cap layer 130 for exposing the semiconductor fin 112. This sacrificial layer may be advantageous to prevent the dielectric cap layer 130 from laterally over-etched, in which the lateral over-etching of dielectric cap layer 130 may cause a short circuit between gate conductor and subsequently formed source/drain regions. Alternatively stated, the dielectric cap layer 130 and the first dielectric layer 152 thereon may have substantially the same etch property, so that they can be etched using the same etching process. For example, in some embodiments where the dielectric cap layer 130 is made of silicon oxide, the first dielectric layer 152 can be made of silicon oxide as well. The second dielectric layer 154 may have an etch property different from that of the first dielectric layer 152. For example, the second dielectric layer 154 has a higher etch resistance to etching the first dielectric layer 152 than that of the first dielectric layer 152. In some embodiments where the first dielectric layer 152 is made of silicon oxide, the second dielectric layer 154 may be made of non-oxide and has a higher etch resistance to etching oxide than that of the first dielectric layer 152. For example, the second dielectric layer 154 may include silicon nitride, silicon oxynitride, silicon carbide, silicon carbonitride, silicon oxycarbonitride, silicon oxycarbide, non-porous dielectric materials, hydrogen doped silicon oxycarbide (SiOC:H) or other suitable dielectric material, except for silicon oxide. Formation of the first and second dielectric layers 152 and 154 may include CVD, PVD, atomic layer deposition (ALD), or other suitable technique.

Figure 5:
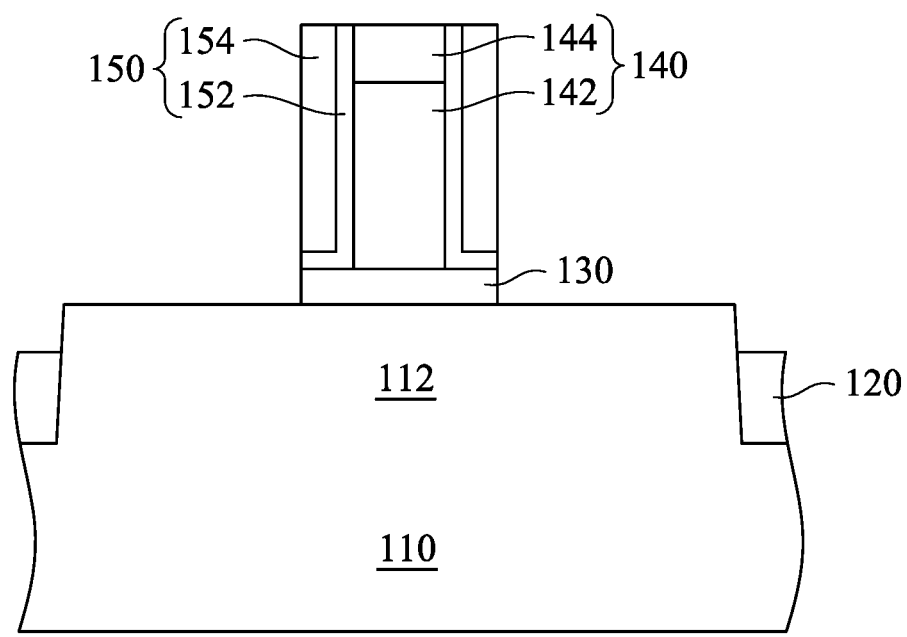

Next, an etching operation, such as anisotropic etching, is performed on the first and second dielectric layers 152 and 154 to form upper gate spacers 150 respectively on opposite sidewalls of the gate structure 140, and the resulting structure is shown in FIG. 5. The etching operation may be a wet etching, a dry etching or combinations thereof. In some embodiments, the etching operation includes a series of etching processes including, for example, an etching process selective to nitride followed by an etching process selective to oxide. Since the upper gate spacers 150 are conformally formed on sidewalls of the gate structure 140, the upper gate spacers 150 may be high enough to block ions from the subsequent implant process into the underlying portions of the semiconductor fin 112 thereof. Therefore, the upper gate spacers 150 can be used to offset subsequently formed doped regions, such as a doped channel region, doped source/drain regions, or combinations thereof. For example, the first dielectric layer 152 may be used to offset a subsequently formed doped channel region in the semiconductor fin 112, and hence a width of the first dielectric layer 152 can be determined based on a desirable or acceptable position of the doped channel region. For example, the width of the first dielectric layer 152 may range from about 0.5 nm to about 5 nm. Moreover, the second dielectric layer 154 may be used to offset a subsequently formed doped source/drain region in the semiconductor fin 112, and hence a width of the second dielectric layer 154 can be determined based on a desirable or acceptable position of the doped source/drain region. In some embodiments, the etching operation for forming the upper gate spacers 150 may also remove portions of the dielectric cap layer 130 not covered by the gate structure 140 and upper gate spacers 150. In some alternative embodiments, portions of the dielectric cap layer 130 not covered by the gate structure 140 and upper gate spacers 150 remain (this arrangement is not shown).

Figure 6:
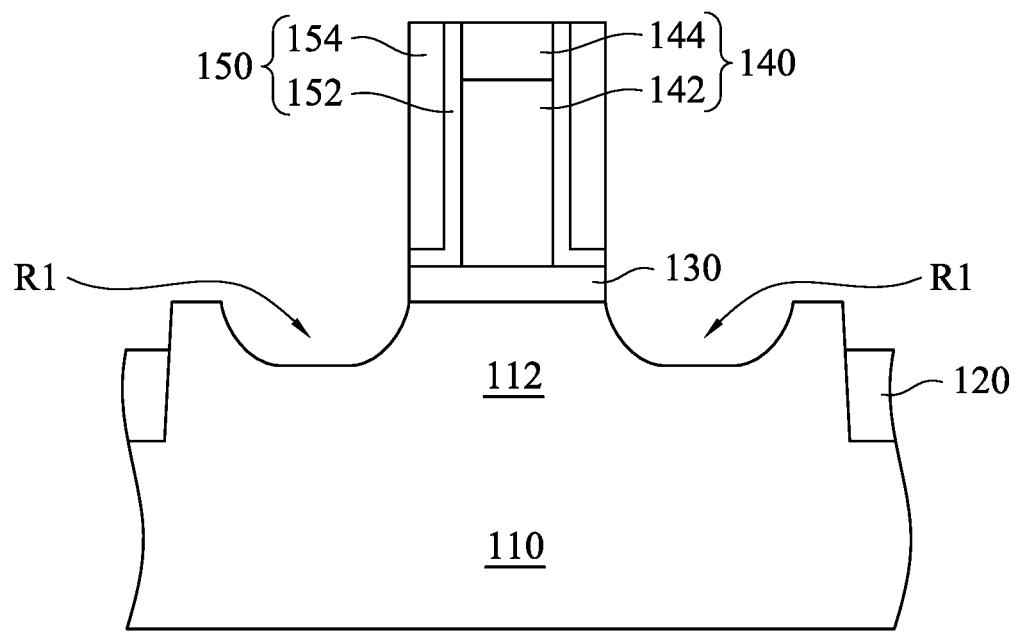

Reference is made to FIG. 6. Portions of the semiconductor fin 112 exposed by the gate structure 140 and the upper gate spacers 150 are removed (or recessed) to form recesses R1 in the semiconductor fin 112. Any suitable amount of material may be removed. The remaining semiconductor fin 112 has a central portion between the recesses R1. The central portion is wrapped by the gate structure 140 and can serve as a semiconductor channel. In some embodiments where the upper gate spacers 150 have predetermined widths, the recesses R1 can be formed to have a substantially U-shaped profile, and a sidewall of the recess R1 can be substantially aligned with the edge (or outer boundary) of the upper gate spacer 150. In some embodiments where the upper gate spacers 150 are thicker than predetermined, the recesses R1 can be formed to have a substantially diamond-shaped profile (not shown), so that a distance between the recess R1 and the semiconductor channel can fall into an acceptable range. That is, some sidewalls of the recesses R1 are extended to underneath the upper gate spacers 150.

Formation of the recesses R1 may include a dry etching process, a wet etching process, or combination dry and wet etching processes. In some embodiments, the substantially U-shaped recesses R1 can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. Formation of the recesses R1 may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. After the etching process, a pre-cleaning process may be performed to clean the recesses R1 with hydrofluoric acid (HF) or other suitable solution in some embodiments.

Figure 7:
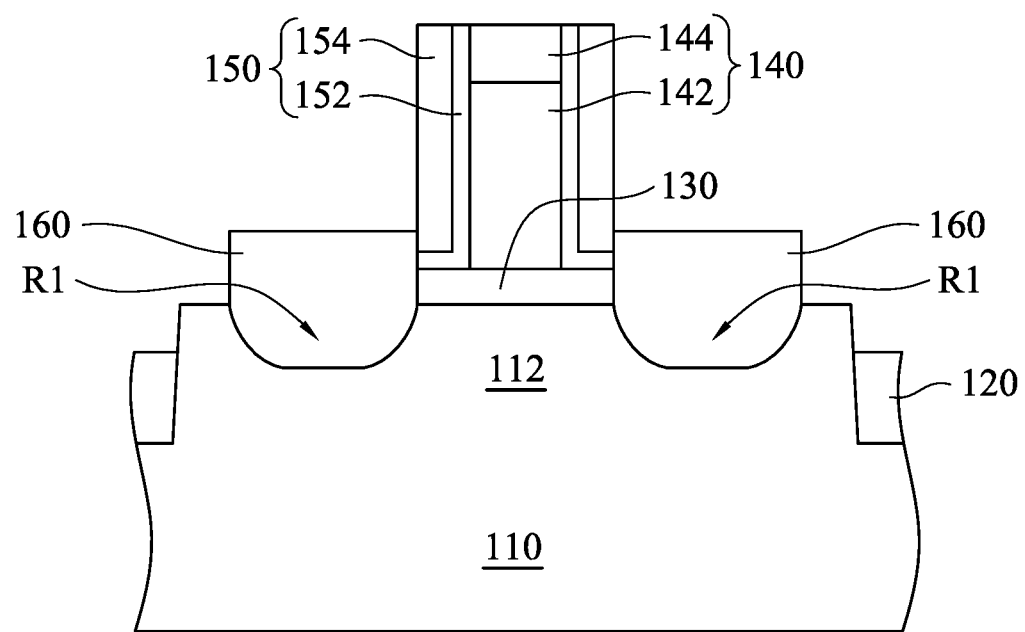

Next, as shown in FIG. 7, a plurality of epitaxy structures 160 are respectively formed in the recesses R1 of the semiconductor fin 112. The epitaxy structures 160 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fin 112. In some embodiments, lattice constants of the epitaxy structures 160 are different from that of the semiconductor fin 112, so that the semiconductor channel between the epitaxy structures 160 can be strained or stressed by the epitaxy structures 160 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 112 (e.g., silicon). Thus, strained or stressed semiconductor channel can be achieved to increase carrier mobility and enhance device performance. The epitaxy structures 160 may be in-situ doped. The doping species include P-type dopants, such as boron or $BF_2$; N-type dopants, such as phosphorus or arsenic; and/or other suitable dopants including combinations thereof. If the epitaxy structures 160 are not in-situ doped, a second implantation process (i.e., a junction implant process) is performed to dope the epitaxy structures 160. One or more annealing processes may be performed to activate the epitaxy structures 160. The annealing processes include rapid thermal annealing (RTA) and/or laser annealing processes.

Figure 8:
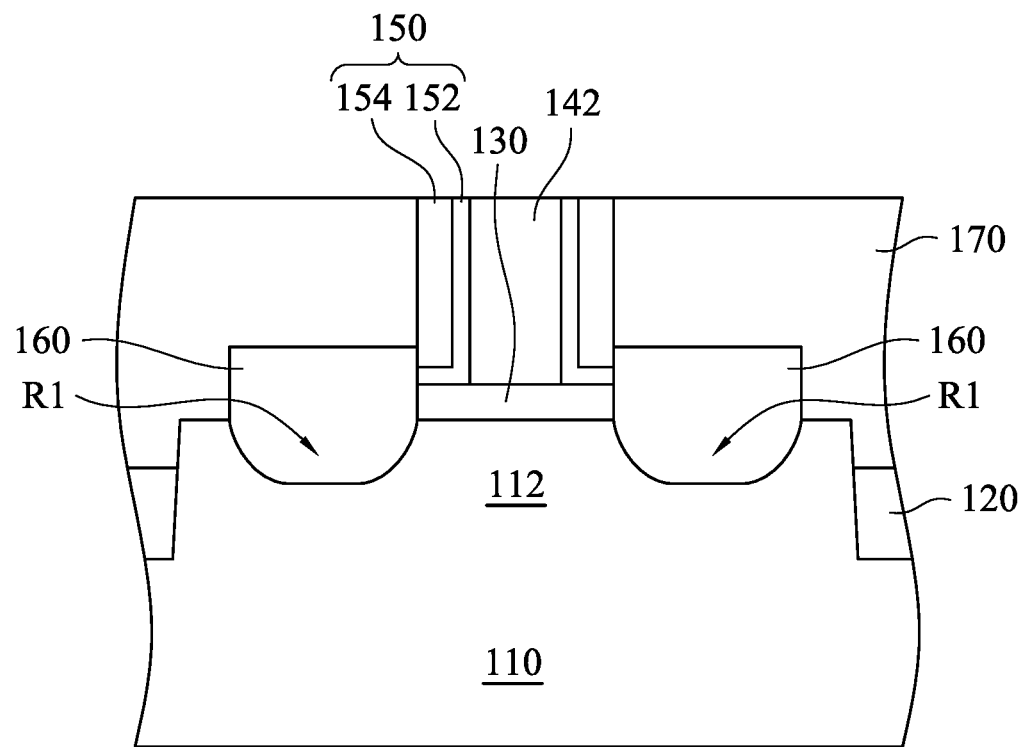

Reference is made to FIG. 8. An interlayer dielectric (ILD) layer 170 is formed at outer sides of the upper gate spacers 150 and on the substrate 110. The ILD layer 170 includes silicon oxide, silicon nitride, silicon oxynitride, silicon carbide, low-k dielectric material or combinations thereof. The ILD layer 170 includes a single layer or multiple layers. The ILD layer 170 may be formed by a suitable technique, such as CVD, ALD, and spin-on (SOG). A chemical mechanical planarization (CMP) process may be performed to remove excessive material of the ILD layer 170 and the mask layer 144 and to expose the gate electrode 142 to a subsequent dummy gate removal process. The CMP process may planarize a top surface of the ILD layer 170 with top surfaces of the gate electrode 142 and upper gate spacers 150 in some embodiments. After the CMP process, uppermost portions of the upper gate spacers 150 abutting the mask layer 144 are removed while other portions of the upper gate spacers 150 remain on sidewalls of the gate electrode 142. The remaining upper gate spacers 150 are high enough to block ions from implanted into the underlying semiconductor fin 112. Exemplary height of the upper gate spacer 150 may range from about 30 nm to about 900 nm. In some embodiments, a difference between height of the upper gate spacer 150 and thickness of the dielectric cap layer 130 may range from about 32 nm to about 906 nm, so that ions can be implanted into a portion of the semiconductor fin 112 through the dielectric cap layer 130 while not implanted into other portions of the semiconductor fin 112 through the upper gate spacers 150.

Figure 9:
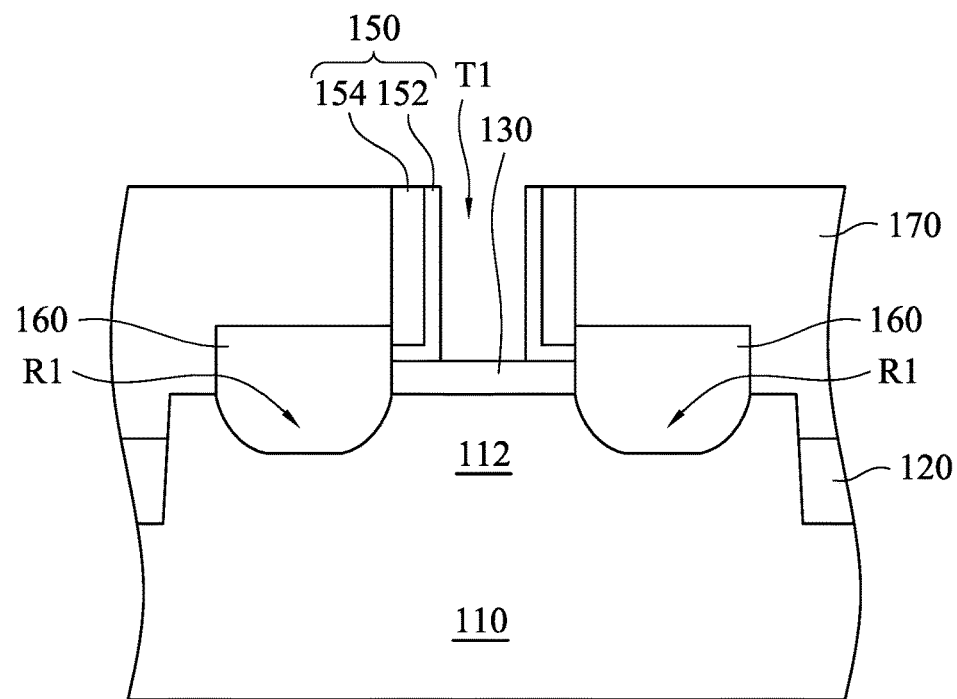

Next, the dummy gate electrode 142 is removed to form a gate trench T1 with the first dielectric layers 152 of the upper gate spacers 150 as its sidewalls, and the resulting structure is shown in FIG. 9. The dummy gate electrode 142 may be removed by dry etching, wet etching, chemical down-stream etching (CDE) or combinations thereof. For example, a wet etching process for removing the dummy gate electrode 142 may include exposure to a hydroxide containing solution (e.g., ammonium hydroxide), deionized water, and/or other suitable etchant solutions.

Figure 10:
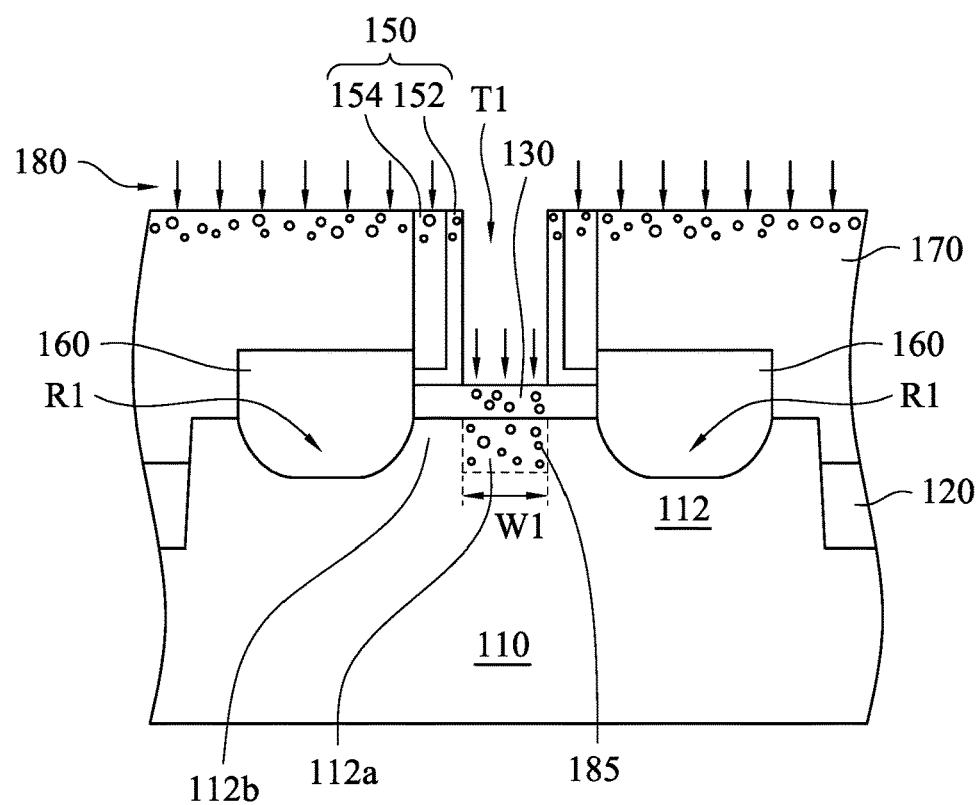

Reference is made to FIG. 10. After the dummy gate electrode 142 shown in FIG. 8 has been removed and the dielectric cap layer 130 is exposed, an ion implantation 180 is performed. Indeed, ions are implanted into a portion of the semiconductor fin 112 underlying the gate trench T1 through the dielectric cap layer 130 disposed over this portion of the semiconductor fin 112, so that a doped channel region 112a is formed under the gate trench T1. The doped channel region 112a has impurities 185 therein, and regions 112b of the semiconductor fin 112 underlying the upper gate spacers 150 are substantially free from the impurities 185 of the doped channel region 112a. In other words, semiconductor region or feature 112a underlying the gate trench T1 has impurities 185 therein, and semiconductor regions or features 112b wrapped by the upper gate spacers 150 are substantially free from the impurities 185 of the semiconductor region or feature 112a. Absence of the impurities 185 in the regions 112b is due to that the upper gate spacers 150 are high enough to block the ions from implanted into the underlying regions 112b thereof. The absence of impurities 185 in the regions 112b may be advantageous to reduce channel impurities that are ineffective for tuning threshold voltage (Vt). This is due to that the regions 112b will not be wrapped by subsequently formed gate conductor, especially work function conductor. Reduction of ineffective channel impurities may obviate degradation of carrier mobility caused by the ineffective channel impurities. Stated differently, the ion implantation 180 is performed after forming the upper gate spacers 150 with sufficient heights, and the upper gate spacers 150 with sufficient heights can thus act as implant barriers or masks for the underlying semiconductor regions 112b to reduce ineffective channel impurities. Furthermore, the ion implantation 180 is performed after some thermal processes, such as annealing for the epitaxy structures 160, so that thermal budget is lowered. Accordingly, out-diffusion of the channel impurities can be reduced due to low thermal budget, and hence positions of the channel impurities can be controlled more precisely.

In some embodiments, the ion implantation 180 may also implant ions into upper portions of the upper gate spacers 150 and the ILD layer 170. That is, upper portions of the upper gate spacers 150 and ILD layer 170 may have the impurities 185 of the doped channel region 112a. In some embodiments, lower portions of the upper gate spacers 150 and the ILD layer 170 may be substantially free from the impurities 185 of the doped channel region 112a. This is due to that the heights of the upper gate spacers 150 and the ILD layer 170 may be high enough to block the ions from implanted into their lower portions.

The implant species, energy, and/or dose may be chosen using, for example, simulation tools. As such, a particular parameter of semiconductor device such as, for example, the threshold voltage, may be tuned to a desirable value. In some embodiments, different implant species, energy, and/or dose may be introduced in different devices using masking (i.e., lithography) in order to obtain devices with different threshold voltages or different polarities (i.e., n-channel or p-channel). Ion implantation 180 may be exemplarily performed at a temperature of between about 25° C. (i.e., room temperature) and about 600° C. in some embodiments. In some embodiments, the ion implantation 180 employs n-type dopants or p-type dopants. In some embodiments, the ion implantation 180 has a normal incidence, i.e., the ion beam is perpendicular to the wafer surface. In some embodiments, the ion implantation 180 has an angled or tilted incidence. Indeed, a variety of different angles may be used to place dopant atoms in a desirable location.

After the ion implantation 180, an annealing process can be performed to repair residual damage in the semiconductor fin 112. For example, the annealing process may be exemplarily performed for between about one microsecond (1 μs) and about ten seconds (10 s) at a temperature of between about 800° C. and about 1200° C. In some embodiments, the annealing process is performed immediately after the ion implantation 180 in an effort to repair the semiconductor fin 112 damage as well as to activate dopant atoms.

Figure 11:
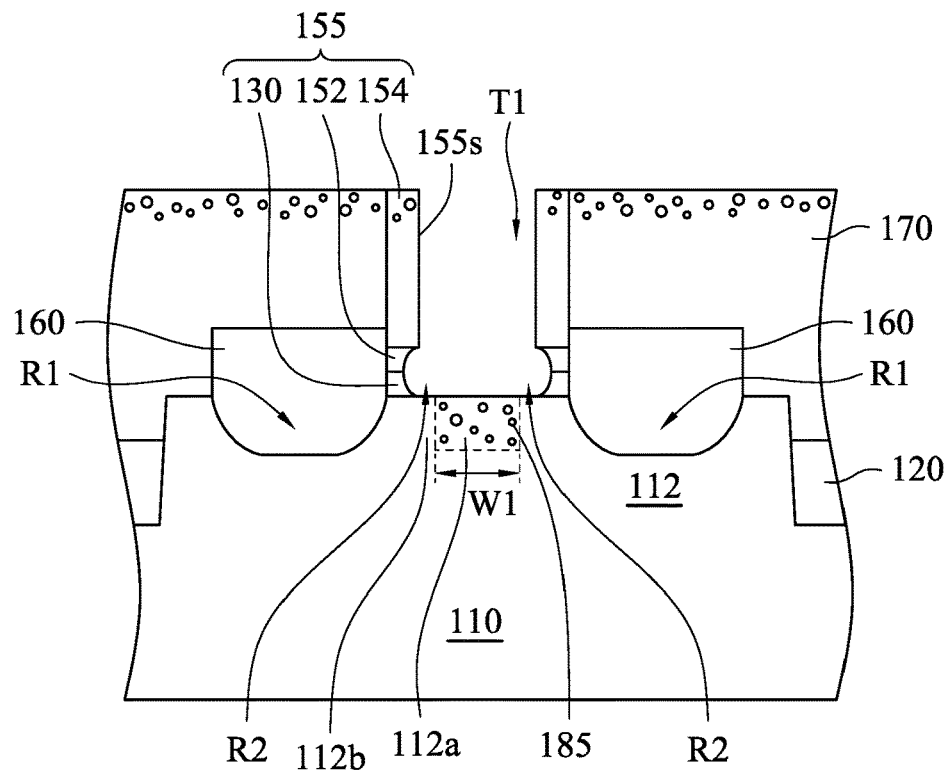

Next, referring to FIG. 11, an etching operation is preformed to remove the dielectric cap layer 130 over the doped channel region 112a. The etching operation at least partially removes the first dielectric layer 152 as well. This is due to that the first dielectric layer 152 and the dielectric cap layer 130 have substantially the same etch property. The etching operation may be an isotropic wet etching, an isotropic dry etching or combinations thereof. The isotropic etching may cause lateral etching of portions of the dielectric cap layer 130 underlying the second dielectric layers 154 to form the recesses R2. Since the first dielectric layer 152 can act as a sacrificial layer to be sacrificed for the etching operation, the dielectric cap layer 130 may not be laterally over-etched to expose the epitaxy structures 160. Therefore, a short circuit between the epitaxy structures 160 and subsequently formed gate conductor can be prevented. As illustrated, the recesses R2 are arranged projectively over the semiconductor regions 112b that are substantially free from the impurities 185 of the doped channel region 112a. In some embodiments where the dielectric cap layer 130 and the first dielectric layer 152 include oxide, the etching operation may include, for example, dipping the substrate 110 in a wet solution comprising diluted HF.

After this etching operation, the second dielectric layers 154 remain on the substrate 110 because they have higher etch resistance to etching oxide than that of the first dielectric layer 152 and the dielectric cap layer 130, so that the remaining second dielectric layers 154, the underlying remaining first dielectric layers 152 and dielectric cap layers 130 can collectively serve as gate spacers 155 for spacing the epitaxy structures 160 apart from subsequently formed gate stack. The second dielectric layers 154 can be referred to as non-sacrificial spacers herein. Upper portion of the gate spacer 155 is the second dielectric layer 154, lower portion of the gate spacer 155 is the remaining first dielectric layer 152 and dielectric cap layer 130 that have etch properties different from that of the second dielectric layer 154, and therefore, the lower portion of the gate spacer 155 is recessed to form the recess R2 while the upper portion of the gate spacer 155 remain not recessed.

As shown in FIGS. 10 and 11, the doped channel region 112a is offset by the first dielectric layers 152, and therefore, the doped channel region 112a may have a width W1 substantially the same as a distance between the first dielectric layers 152. Because the second dielectric layers 154 abut outer sidewalls of the first dielectric layers 152, a distance between the second dielectric layers 154 is greater than the width W1 of the doped channel region 112a. Therefore, after forming the gate spacers 155, the width W1 of the doped channel region 112a is less than the distance between the gate spacers 155. Because gate dielectric is subsequently formed on inner sidewall 155s of the gate spacers 155 and interposed between the subsequently formed gate conductor and the gate spacers 155, this difference between the width W1 and the distance between the gate spacers 155 may be advantageous to concentrate the impurities 185 within a region covered or wrapped by the subsequently formed gate conductor. As such, channel impurities that are ineffective for tuning threshold voltage can be further reduced, so that degradation of carrier mobility can be further prevented.

Figure 12:
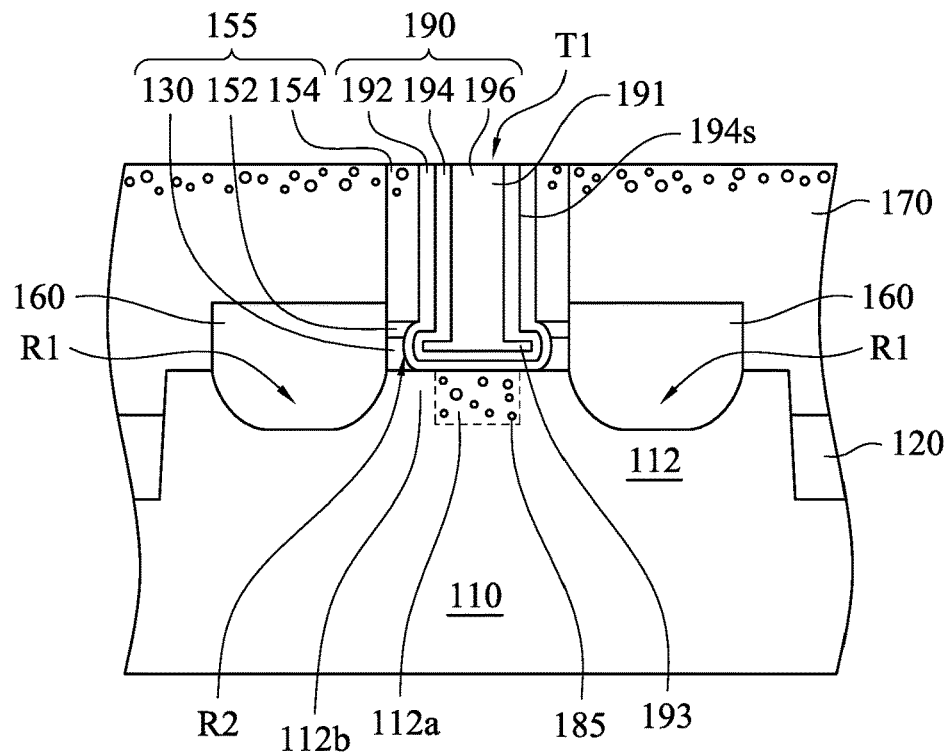

Reference is made to FIG. 12. Gate stack 190 is formed in the gate trench T1. The gate stack 190 straddles across the semiconductor fin 112 and extends along the gate spacers 155. Portions of the gate stack 190 are embeddedly retained in the recesses R2 because the recesses R2 are communicated with the gate trench T1. More particularly, the gate stack 190 includes a main portion 191 and an embedded portion 193 protruding from a sidewall of the main portion 191. The main portion 191 is sandwiched between the gate spacers 155, and the embedded portions 193 are embedded in the gate spacers 155, respectively. Stated differently, the embedded portions 193 are respectively received in the recesses R2 in an embedded manner. The main portion 191 overlies the doped channel region 112a, and the embedded portions 193 respectively overlie the semiconductor regions 112b substantially free from the impurities 185 of the doped channel region 112a.

The gate stack 190 may include a gate dielectric 192, a work function conductor 194 on the gate dielectric 192 and a filling conductor 196 on the work function conductor 194, in which the work function conductor 194 and the filling conductor 196 can be collectively referred to as gate conductor. In some embodiments, portions of the gate dielectric 192, work function conductor 194 and filling conductor 196 may be embeddedly retained in the recesses R2 of the gate spacers 155. Stated differently, the embedded portions 193 may include portions of the gate dielectric 192, work function conductor 194 and filling conductor 196. Since the recesses R2 are arranged over the semiconductor regions 112b substantially free from the impurities 185 of the doped channel region 112a, the portions of the gate dielectric 192, work function conductor 194 and filling conductor 196 embeddedly retained in the recesses R2 overlie the semiconductor regions 112b as well. Moreover, the main portion 191 of the gate stack 190 includes portions of gate dielectric 192 not embedded in the gate spacers 155, and these portions of the gate dielectric 192 may overlie the semiconductor regions 112b. In other words, the semiconductor regions 112b substantially free from the channel impurities 185 may extend to under the main portion 191. Alternatively stated, the main portion 191 of the gate stack 190 overlies a boundary of regions 112a and 112b. In some embodiments where the gate stack 190 is a high-k metal gate structure, portions of high-k dielectric and gate metals may be embeddedly retained in the recesses R2 over the semiconductor regions 112b that are substantially free from the channel impurities 185.

In some embodiments, the gate dielectric 192 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric 192 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 192 may have a multilayer structure such as one layer of silicon oxide (e.g., interfacial layer) and another layer of high-k material.

The work function conductor 194 may include work function metals to provide a suitable work function for the gate stack 190. In some embodiments, the work function conductor 194 has an outer sidewall 194s proximal to the gate dielectric 192. The outer sidewall 194s of the work function conductor 194 may be substantially aligned with a boundary of the regions 112a and 112b. This substantial alignment may be advantageous to make majority of the gate conductor has a width substantially the same as the width of the doped channel region 112a, so as to further reduce ineffective channel impurities. This substantial alignment can be achieved by forming the first dielectric layer 152 (see FIG. 10) with a predetermined thickness for offsetting the doped channel region 112a to a predetermined position, and by forming the gate dielectric 192 with a predetermined thickness for offsetting the gate conductor to the predetermined position of the doped channel region 112a.

In some embodiments, the work function conductor 194 may include one or more n-type work function metals (N-metal) for forming an n-type transistor on the semiconductor fin 112. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductor 194 may include one or more p-type work function metals (P-metal) for forming a p-type transistor on the semiconductor fin 112. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The filling conductor 196 fills a recess in the work function conductor 194. The filling conductors 196 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate stack 190 may include blanket forming a gate dielectric layer over the structure shown in FIG. 11, forming one or more work function conductor layers over the blanket gate dielectric layer, forming a filling conductor layer over the work function conductor layers, wherein some portions of the filling conductor layer overfill the gate trench T1 shown in FIG. 11, and performing a CMP process to remove excessive materials of the filling conductor layer, work function conductor layers and gate dielectric layer outside the gate trench T1.

Figure 13:
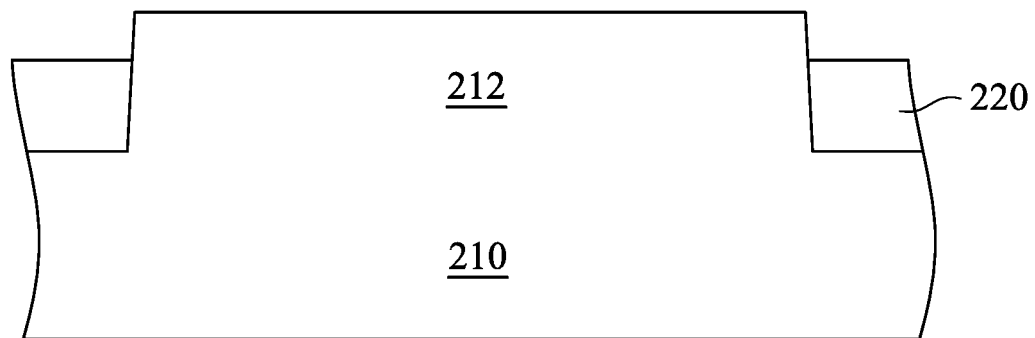
FIG. 13 to FIG. 24 illustrate a method for manufacturing a semiconductor device at various stages in accordance with some embodiments of the present disclosure.

FIG. 13 to FIG. 24 illustrate a method for manufacturing a semiconductor device at various stages in accordance with some embodiments of the present disclosure. Referring to FIG. 13, the method includes forming one or more semiconductor fins 212 on the substrate 210, forming an isolation dielectric 220 to fill trenches between the semiconductor fins 212 as STI, optionally performing a planarization process to remove the excess isolation dielectric 220 outside the trenches, and then performing an etching process on the isolation dielectric until upper portions of the semiconductor fins 212 are exposed. Exemplary formation methods and materials of the fins and STI are discussed previously and will not be repeated.

Figure 14:
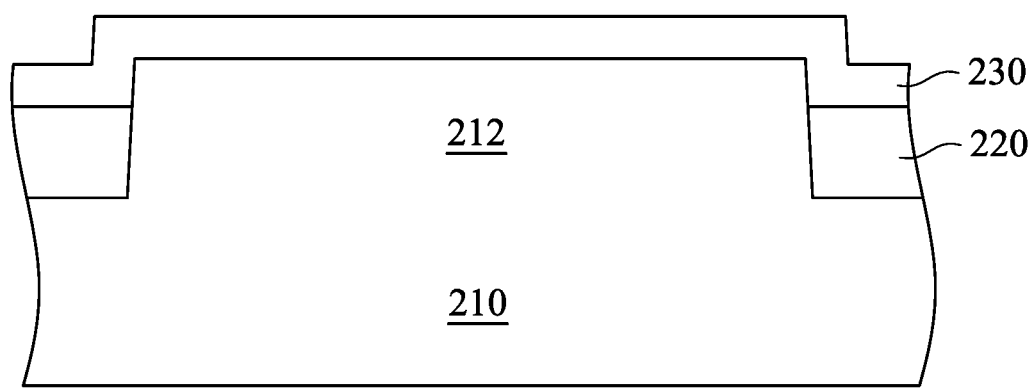

Next, as shown in FIG. 14, a dielectric cap layer 230 is blanket formed on the structure shown in FIG. 13, and it can be used for implantation screening and reduction of the channeling effect during the subsequent implantation. The dielectric cap layer 130 may include silicon oxide, ranging from about 2 nm to about 6 nm in thickness, as examples. Formation of the oxide layer 230 may exemplarily include deposition, such as CVD or physical vapor deposition (PVD).

Figure 15:
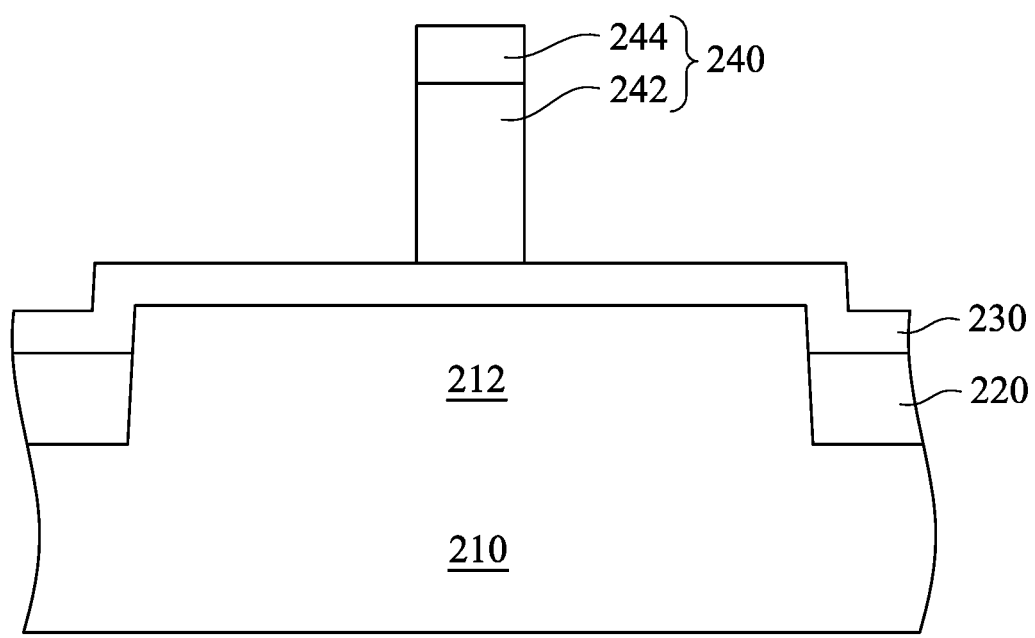

Reference is made to FIG. 15. Gate structure 240 is formed on the dielectric cap layer 230 using suitable methods as discussed previously. The gate structure 240 includes a gate electrode 242 with a mask layer 244 over the gate electrode 242. The gate electrode 242 and mask layer 244 may include suitable materials as discussed previously. A central portion of the semiconductor fin 212 can be wrapped by the gate structure 240. In some embodiments, the gate structure 240 is a dummy gate structure and will be replaced with a replacement gate structure using a "gate-last" or replacement-gate process. In other embodiments, the gate structure 240 is an active gate and is formed in a "gate-first process" and will not be replaced.

Figure 16:
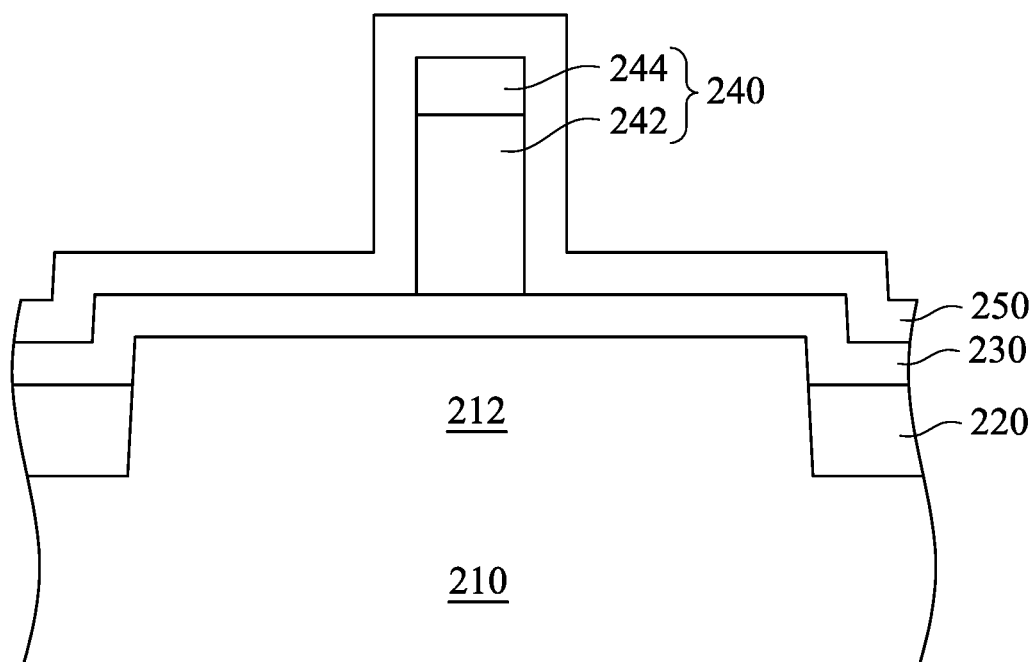

Reference is made to FIG. 16. Dielectric layer 250 is blanket formed on the structure shown in FIG. 15. The dielectric layer 250 conformally covers the gate structure 240 and the dielectric cap layer 230. The dielectric layer 250 may have an etch property different from that of the dielectric cap layer 230. For example, the dielectric layer 250 has a higher etch resistance to etching the dielectric cap layer 230 than that of the dielectric cap layer 230. In some embodiments where the dielectric cap layer 230 is made of silicon oxide, the dielectric layer 250 may be made of non-oxide with a higher etch resistance to etching oxide than that of the dielectric cap layer 230. For example, the dielectric layer 250 may include silicon nitride, silicon oxynitride, silicon carbide, silicon carbonitride, silicon oxycarbonitride, silicon oxycarbide, non-porous dielectric materials, hydrogen doped silicon oxycarbide (SiOC:H) or other suitable dielectric material, except for silicon oxide. Formation of the dielectric layer 250 may include CVD, PVD, ALD, or other suitable techniques.

Figure 17:
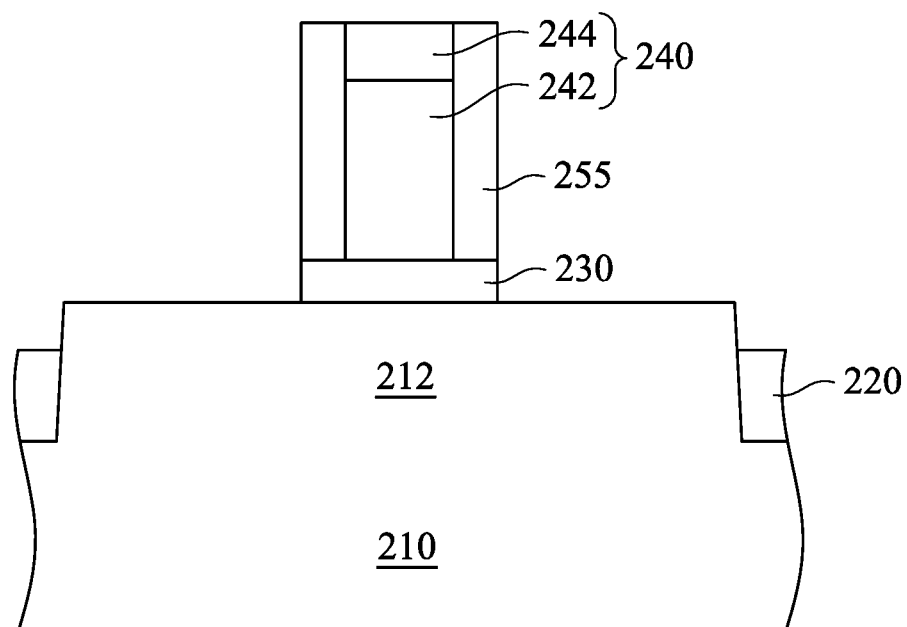

Next, an etching operation, such as anisotropic etching, is performed on the dielectric layer 250 to form upper gate spacers 255 respectively on opposite sidewalls of the gate structure 240, and the resulting structure is shown in FIG. 17. The etching operation may be a wet etching, a dry etching or combinations thereof. In some embodiments, the etching operation includes a series of etching processes which include, for example, an etching process selective to nitride followed by an etching process selective to oxide, so that portions of the cap oxide layer 230 covered by the gate structure 240 and upper gate spacers 255 remain while other portions of the cap oxide layer 230 are removed. Alternative, portions of the dielectric cap layer 230 not covered by the gate structure 240 and upper gate spacers 255 may remain (this arrangement is not shown). Since the upper gate spacers 255 are conformally formed on sidewalls of the gate structure 240, the upper gate spacers 255 may be high enough to block ions from the subsequent implant process into the underlying portions of the semiconductor fin 212 thereof. Therefore, the upper gate spacers 255 can be used to offset subsequently formed doped regions, such as a doped channel region, doped source/drain regions, or combinations thereof, and hence a width of the upper gate spacer 255 can be determined based on desirable or acceptable positions of the doped channel region and the doped source/drain regions.

Figure 18:
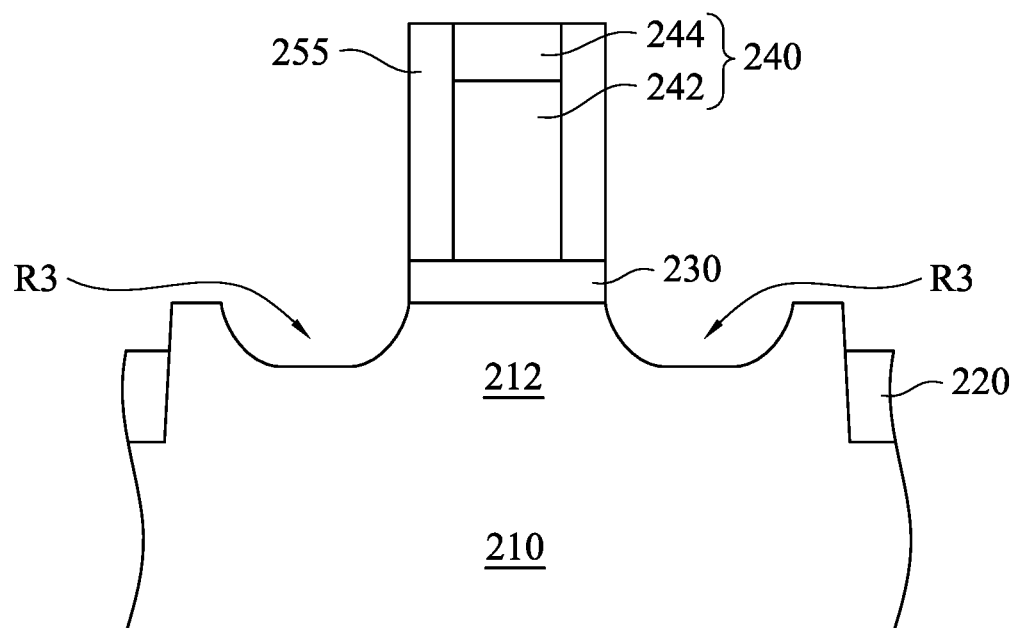

Reference is made to FIG. 18. Portions of the semiconductor fin 212 exposed by the gate structure 240 and the upper gate spacers 255 are removed (or recessed) to form recesses R3 in the semiconductor fin 212, using methods as discussed previously. The remaining semiconductor fin 212 has a central portion between the recesses R3. The central portion is wrapped by the gate structure 240 and can serve as a semiconductor channel. Etching parameters of etching for forming the recesses R3 can be tuned to achieve a predetermined recess process.

Figure 19:
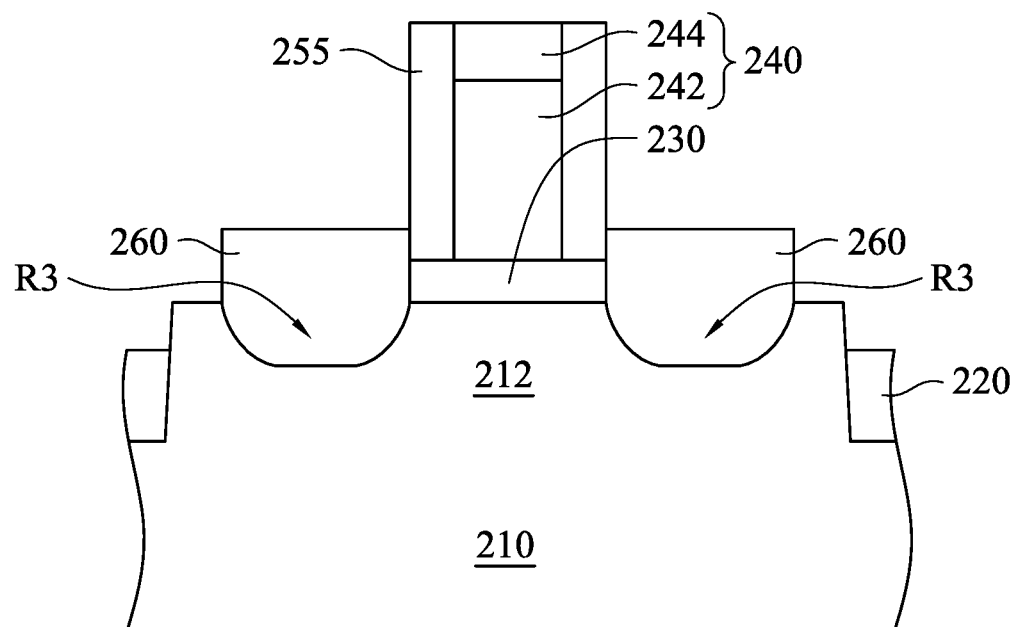

Next, as shown in FIG. 19, a plurality of epitaxy structures 260 are respectively formed in the recesses R3 of the semiconductor fin 212. Exemplary formation methods and materials of the epitaxy structures 260 are discussed previously and will not be repeated. The epitaxy structures 260 may be doped with suitable dopants using suitable techniques as discussed previously. One or more annealing processes may be performed to activate the epitaxy structures 260. The annealing processes include rapid thermal annealing (RTA) and/or laser annealing processes.

Figure 20:
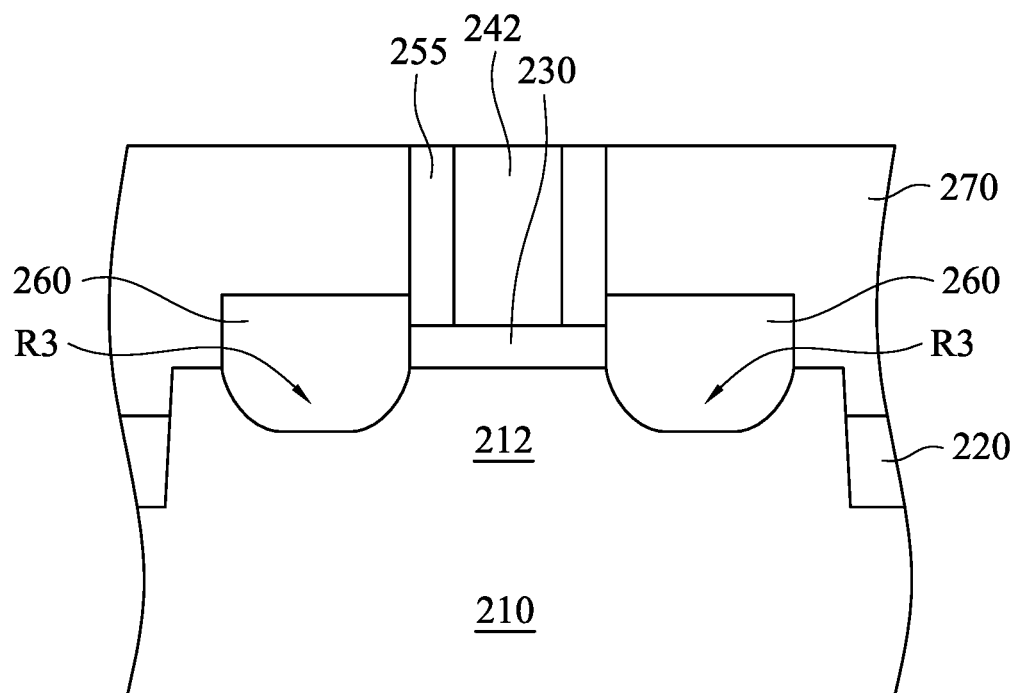

Reference is made to FIG. 20. An interlayer dielectric (ILD) layer 270 is formed at outer sides of the upper gate spacers 255 and on the substrate 210. The ILD layer 270 includes silicon oxide, silicon nitride, silicon oxynitride, silicon carbide, low-k dielectric material or combinations thereof. The ILD layer 270 includes a single layer or multiple layers. The ILD layer 270 may be formed using suitable techniques as discussed previously. A chemical mechanical planarization (CMP) process may be performed to remove excessive material of the ILD layer 270 and the mask layer 244 and to expose the gate electrode 242 to a subsequent dummy gate removal process. The CMP process may planarize a top surface of the ILD layer 270 with top surfaces of the gate electrode 242 and upper gate spacers 255 in some embodiments.

Figure 21:
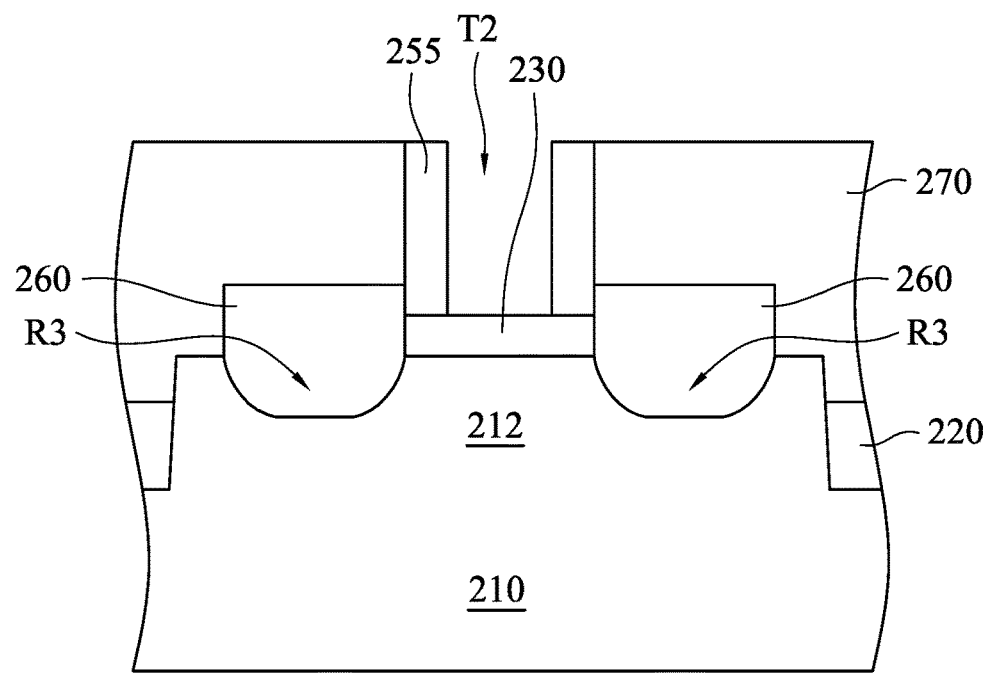

Next, the dummy gate electrode 242 is removed to form a gate trench T2 with the upper gate spacers 255 as its sidewalls. The resulting structure is shown in FIG. 21. The dummy gate electrode 242 may be removed by suitable techniques as discussed previously.

Figure 22:
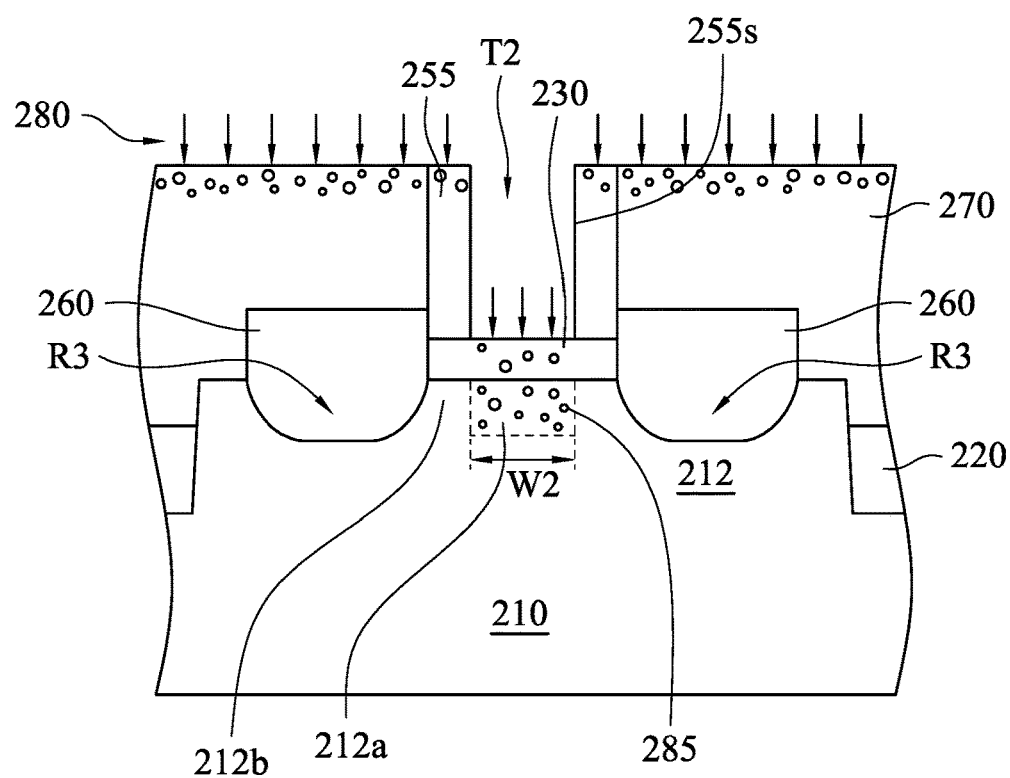

Reference is made to FIG. 22. After the dummy gate electrode 242 shown in FIG. 20 has been removed and the dielectric cap layer 230 is exposed, an ion implantation 280 is performed. Indeed, ions are implanted into a portion of the semiconductor fin 212 underlying the gate trench T2 through the dielectric cap layer 230 disposed over this portion of the semiconductor fin 212, so that a doped channel region 212a is formed under the gate trench T2. The doped channel region 212a has impurities 285 therein, and regions 212b of the semiconductor fin 212 underlying the upper gate spacers 255 are substantially free from the impurities 285 of the doped channel region 212a. In other words, semiconductor region or feature 212a underlying the gate trench T2 has impurities 285 therein, and semiconductor regions or features 212b wrapped by the upper gate spacers 255 are substantially free from the impurities 285 of the semiconductor region or feature 212a. Absence of the impurities 285 in the regions 212b is due to that the gate spacers 155 are high enough to block the ions from implanted into the underlying regions 212b. The absence of impurities 285 in the regions 212b may be advantageous to reduce channel impurities that are ineffective for tuning threshold voltage. As such, degradation of carrier mobility caused by the ineffective channel impurities may be obviated. Stated differently, the ion implantation 280 is performed after forming the upper gate spacers 255 with sufficient heights, and the upper gate spacers 255 with sufficient heights can thus act as implant barriers or masks for the underlying semiconductor regions 212b to reduce ineffective channel impurities. Furthermore, the ion implantation 280 is performed after some thermal processes, such as annealing for the epitaxy structures 260, so that thermal budget is lowered. Accordingly, out-diffusion of the channel impurities can be reduced due to low thermal budget, and hence positions of the channel impurities can be controlled more precisely.

The doped channel region 212a is offset by the upper gate spacers 255, and therefore, the doped channel region 212a may have a width W2 substantially the same as a distance between the upper gate spacers 255. In other words, the upper gate spacer 255 has an inner sidewall 255s that may be substantially aligned with a boundary of the regions 212a and 212b according to some embodiments.

In some embodiments, the ion implantation 280 may also implant ions into upper portions of the upper gate spacers 255 and the ILD layer 270. That is, upper portions of the upper gate spacers 255 and ILD layer 270 may have the impurities 285 of the doped channel region 212a. In some embodiments, lower portions of the upper gate spacers 255 and the ILD layer 270 may be substantially free from the impurities 285 of the doped channel region 212a. This is due to that the heights of the upper gate spacers 255 and the ILD layer 270 may be high enough to block the ions from implanted into their lower portions.

Exemplary parameters of the ion implantation 280 are similar to that of the previous ion implantation 180 and will not be repeatedly discussed. After the ion implantation 280, an annealing process can be performed to repair residual damage in the semiconductor fin 212. Exemplary parameters of the annealing process are similar to that of the previous annealing performed after the ion implantation 180 and will not be repeatedly discussed. In some embodiments, the annealing process is performed immediately after the ion implantation 280 in an effort to repair the semiconductor fin 212 damage as well as to activate dopant atoms.

Figure 23:
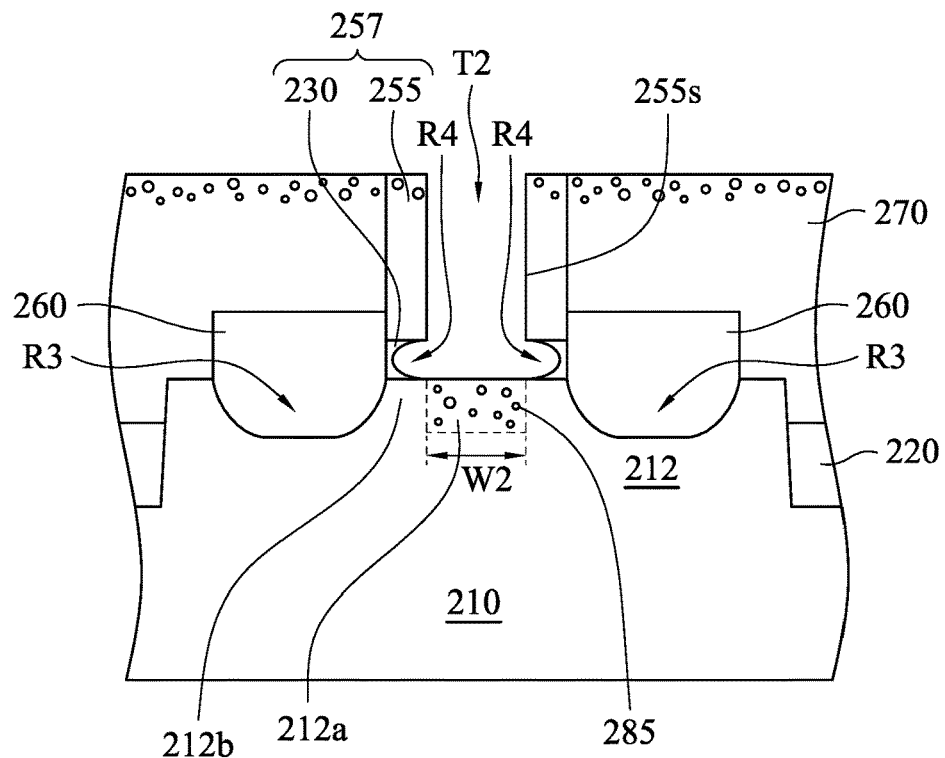

Next, referring to FIG. 23, an etching operation is preformed to remove the dielectric cap layer 230 over the doped channel region 212a. The etching operation may be an isotropic wet etching, an isotropic dry etching or combinations thereof. The isotropic etching may cause lateral etching of portions of the dielectric cap layer 230 underlying the upper gate spacers 255 to form the recesses R4. As illustrated, the recesses R4 are arranged projectively over the semiconductor regions 212b that are substantially free from the impurities 285 of the doped channel region 212a. In some embodiments where the dielectric cap layer 230 includes oxide, the etching operation may include, for example, dipping the substrate 210 in a wet solution comprising diluted HF.

After this etching operation, the upper gate spacers 255 remain on the substrate 210 because they have higher etch resistance to etching oxide than that of the dielectric cap layer 230. In some embodiments, some portions of the dielectric cap layer 230 may remain under the upper gate spacers 255 and define the recesses R4. The remaining dielectric cap layers 230 and their overlying upper gate spacers 255 can be collectively referred to as gate spacers 257 for spacing the epitaxy structures 260 apart from subsequently formed gate stack.

Figure 24:
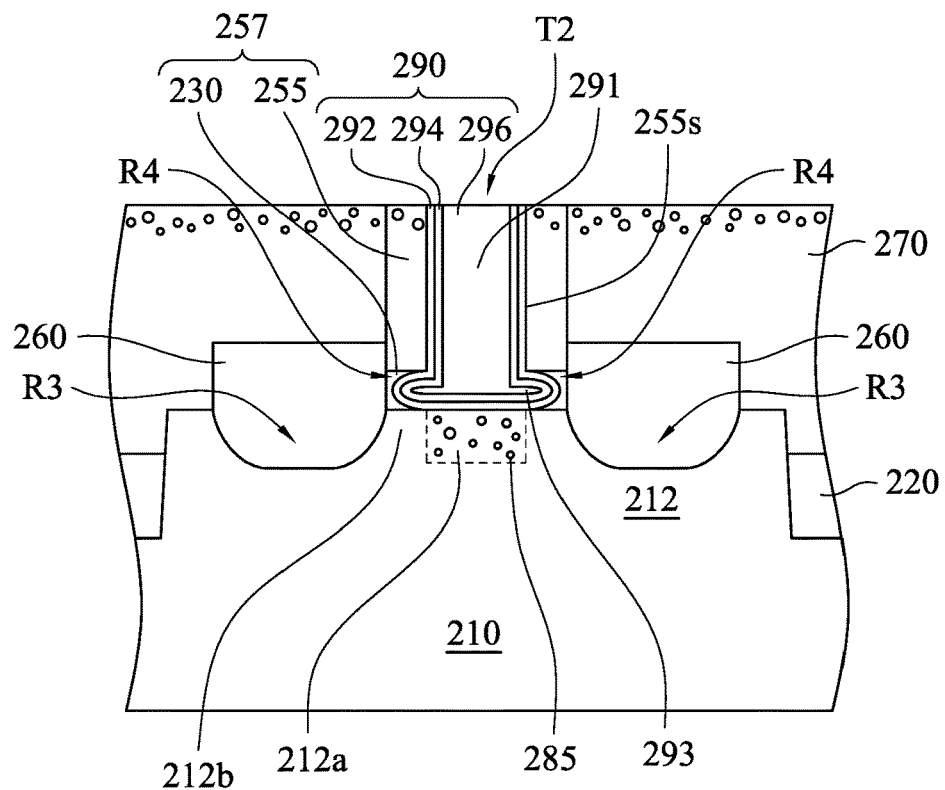

Reference is made to FIG. 24. Gate stack 290 is formed in the gate trench T2. The gate stack 290 straddles across the semiconductor fin 212 and extends along the gate spacers 257. Portions of the gate stack 290 are embeddedly retained in the recesses R4 because the recesses R4 are communicated with the gate trench T2. More particularly, the gate stack 290 includes a main portion 291 and an embedded portion 293 protruding from a sidewall of the main portion 291. The main portion 291 is sandwiched between the gate spacers 257, and the embedded portions 293 are embedded in the gate spacers 257, respectively. Stated differently, the embedded portions 293 are respectively received in the recesses R4 in an embedded manner. The main portion 291 overlies the doped channel region 212a, and the embedded portions 293 respectively overlie the semiconductor region 212b substantially free from the impurities 285 of the doped channel region 212a.

The gate stack 290 may include a gate dielectric 292, a work function conductor 294 on the gate dielectric 292 and a filling conductor 296 on the work function conductor 294, in which the work function conductor 294 and the filling conductor 296 can be collectively referred to as gate conductor. In some embodiments, portions of the gate dielectric 292, work function conductor 294 and filling conductor 296 may be embeddedly retained in the recesses R4 of the gate spacers 257. Stated differently, the embedded portions 293 may include portions of the gate dielectric 292, work function conductor 294 and filling conductor 296. Since the recesses R4 are arranged over the semiconductor regions 212b substantially free from the impurities 285 of the doped channel region 212a, the portions of the gate dielectric 292, work function conductor 294 and filling conductor 296 embeddedly retained in the recesses R4 overlie the semiconductor regions 212b as well. In some embodiments where the gate stack 290 is a high-k metal gate structure, portions of high-k dielectric and gate metals may be embeddedly retained in the recesses R4 over the semiconductor regions 212b that are substantially free from the channel impurities 185. In some embodiments, an interface between the gate dielectric 292 and the work function conductor 294 has a curved segment with a apex directly below the upper gate spacers 255 of the gate spacers 257 and directly above bottommost surfaces of the dielectric cap layers 230 of the gate spacers 257. In some embodiments, an interface between the work function conductor 294 and the filling conductor 296 has a curved segment extending horizontally beyond an outermost edge of the first semiconductor feature 212a and having an apex at a position directly below the upper gate spacers 255 of the gate spacers 257 and directly above bottommost surfaces of the dielectric cap layers 230 of the gate spacers 257.

In some embodiments, the gate dielectric 292 may include high-k dielectric materials as discussed previously. The work function conductor 294 may include suitable work function metals, and the filling conductor 296 may include suitable filling metals, as discussed previously. Exemplary method of forming the gate stack 290 may include blanket forming a gate dielectric layer over the structure shown in FIG. 23, forming one or more work function conductor layers over the blanket gate dielectric layer, forming a filling conductor layer over the work function conductor layers, wherein some portions of the filling conductor layer overfill the gate trench T2 shown in FIG. 23, and performing a CMP process to remove excessive materials of the filling conductor layer, work function conductor layers and gate dielectric layer outside the gate trench T2.

Embodiments of the present disclosure have some advantages as follows. A semiconductor feature, which is covered by the gate spacer and substantially free from channel impurities, may be advantageous to reduce channel impurities that are ineffective for tuning threshold voltage, and hence degradation of carrier mobility caused by the ineffective channel impurities may be obviated. Moreover, channel implantation is performed after some thermal processes, such as annealing for source/drain dopants, and therefore, out-diffusion of the channel impurities can be reduced due to low thermal budget, so that positions of the channel impurities can be controlled more precisely. Further, some embodiments employ a sacrificial spacer that can be removed during stripping the dielectric cap over the doped channel, and hence it may be advantageous to prevent lateral over-etching of the dielectric cap, so that a short circuit between the gate conductor and source/drain regions can be prevented. Furthermore, the sacrificial spacer may be advantageous to offset the doped channel corresponding to the position of the gate conductor, so that ineffective channel impurities can be further reduced.

According to some embodiments, a method includes forming a dielectric cap over a semiconductor substrate; forming a dummy gate structure over the dielectric cap;

forming gate spacers on opposite sidewalls of the dummy gate structure and on a top surface of the dielectric cap; removing the dummy gate structure to form a gate trench between the gate spacers and exposing the dielectric cap; and performing an ion implantation to form a doped region in the semiconductor substrate through the dielectric cap.

According to some embodiments, a method includes forming a dielectric cap over a semiconductor substrate; forming a dummy gate structure over the dielectric cap; forming gate spacers on opposite sidewalls of the dummy gate structure; forming source/drain structures in the semiconductor substrate and on opposite sides of the dummy gate structure; forming an interlayer dielectric (ILD) layer over the source/drain structures and adjacent to the gate spacers; removing the dummy gate structure to expose the dielectric cap; and performing an ion implantation to form impurities in the dielectric cap, the gate spacers, and the ILD layer.

According to some embodiments, a method includes forming a dielectric cap over a semiconductor substrate; forming a dummy gate structure over the dielectric cap; forming a first dielectric layer blanket over the dielectric cap and the dummy gate structure; forming a second dielectric layer over the first dielectric layer; etching the first dielectric layer and the second dielectric layer, such that a remainder of first dielectric layer and a remainder of the second dielectric layer serve as gate spacers on opposite sidewalls of the dummy gate structure; removing the dummy gate structure to expose the dielectric cap; performing an ion implantation to form impurities in a first portion of the semiconductor substrate, in which second portions of the semiconductor substrate vertically under the gate spacers are free of the impurities; and breaking through the dielectric cap by an etching process, in which the etching process also forms recesses in a remainder of the dielectric cap, and the recesses are vertically between the gate spacers and the second portions of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric cap over a semiconductor substrate;
    forming a dummy gate structure over the dielectric cap;
    forming gate spacers on opposite sidewalls of the dummy gate structure and on a top surface of the dielectric cap, wherein each of the gate spacers comprises a first dielectric layer and a second dielectric layer over the first dielectric layer, the first dielectric layer comprising a vertical portion along a sidewall of the second dielectric layer and a lateral portion along a bottom surface of the second dielectric layer;
    removing the dummy gate structure to form a gate trench between the gate spacers and exposing the dielectric cap;
    performing an ion implantation to form a doped region in the semiconductor substrate through the dielectric cap; and
    removing the vertical portion of the first dielectric layer of each of the gate spacers, while leaving the lateral portion of the first dielectric layer of each of the gate spacers remaining under the second dielectric layer of each of the gate spacers.

2. The method of claim 1, further comprising removing a portion of the dielectric cap to expose the semiconductor substrate after performing the ion implantation.

3. The method of claim 2, wherein removing the portion of the dielectric cap is performed such that a remaining portion of the dielectric cap has a curved surface vertically below one of the gate spacers.

4. The method of claim 3, further comprising forming a gate structure in the gate trench after removing the portion of the dielectric cap, such that the gate structure has a portion extending below the one of the gate spacers and contacting the curved surface of the dielectric cap.

5. The method of claim 1, further comprising:
    after forming the gate spacers, etching the semiconductor substrate using the dielectric cap, the dummy gate structure, and the gate spacers as an etch mask to form recesses in the semiconductor substrate; and
    forming epitaxy structures respectively in the recesses, such that the epitaxy structures contact the dielectric cap.

6. The method of claim 1, wherein the ion implantation is performed such that impurities are formed in upper portions of the gate spacers.

7. The method of claim 1, wherein the ion implantation is performed such that portions of the semiconductor substrate vertically below the gate spacers are free from impurities of the doped region.

8. The method of claim 1, wherein the ion implantation is performed such that impurities are formed in the vertical portion of the first dielectric layer of each of the gate spacers.

9. A method, comprising:
    forming a dielectric cap over a semiconductor substrate;
    forming a dummy gate structure over the dielectric cap;
    forming gate spacers on opposite sidewalls of the dummy gate structure, wherein each of the gate spacers comprise a first dielectric layer and a second dielectric layer over the first dielectric layer;
    forming source/drain structures in the semiconductor substrate and on opposite sides of the dummy gate structure;
    forming an interlayer dielectric (ILD) layer over the source/drain structures and adjacent to the gate spacers;
    removing the dummy gate structure to expose the dielectric cap;
    performing an ion implantation to form impurities in the dielectric cap, the gate spacers, and the ILD layer; and
    after performing the ion implantation, performing an etching operation to laterally trim the gate spacers, such that a sidewall of the second dielectric layer of each of the gate spacers is exposed.

10. The method of claim 9, wherein:
    forming the dielectric cap comprises forming a third dielectric layer over the semiconductor substrate; and
    forming the gate spacers comprises depositing spacer layers of the first and second dielectric layers over the dielectric layer, and performing an etching process to the spacer layers of the first and second dielectric layers to form the gate spacers, wherein the etching process also removes a first portion of the third dielectric layer to expose the semiconductor substrate, while leaving a second portion of the third dielectric layer under the gate spacers and the dummy gate structure as the dielectric cap.

11. The method of claim 9, wherein the ion implantation is performed such that first portions of the dielectric cap under the gate spacers are free from the impurities.

12. The method of claim 11, further comprising removing a second portion of the dielectric cap having the impurities to expose the semiconductor substrate.

13. The method of claim 9, wherein the ion implantation is performed such that impurities are formed in the semiconductor substrate through the dielectric cap.

14. The method of claim 9, wherein the etching operation further breaks through the dielectric cap.

15. A method, comprising:
   forming a dielectric cap over a semiconductor substrate;
   forming a dummy gate structure over the dielectric cap;
   forming a first dielectric layer blanket over the dielectric cap and the dummy gate structure;
   forming a second dielectric layer over the first dielectric layer;
   etching the first dielectric layer and the second dielectric layer, such that a remainder of first dielectric layer and a remainder of the second dielectric layer serve as gate spacers on opposite sidewalls of the dummy gate structure;
   removing the dummy gate structure to expose the dielectric cap;
   performing an ion implantation to form impurities in a first portion of the semiconductor substrate, wherein second portions of the semiconductor substrate vertically under the gate spacers are free of the impurities, wherein the ion implantation is performed such that impurities are formed in an upper portion of the remainder of the first dielectric layer in the gate spacers; and
   breaking through the dielectric cap by an etching process, wherein the etching process also forms recesses in a remainder of the dielectric cap, and the recesses are vertically between the gate spacers and the second portions of the semiconductor substrate, and wherein the upper portion of the remainder of the first dielectric layer in the gate spacers is removed during breaking through the dielectric cap.

16. The method of claim 15, wherein removing the portion of the dielectric cap further comprising trimming the remainder of the first dielectric layer in the gate spacers.

17. The method of claim 15, further comprising forming a gate structure over the first portion of the semiconductor substrate after breaking through the dielectric cap, such that the gate structure fills the recesses in the remainder of the dielectric cap.

18. The method of claim 17, wherein:
   forming the dummy gate structure is performed such that a bottom surface of the dummy gate structure is in contact with the dielectric cap; and
   forming the gate structure is performed such that a bottom surface of the gate structure is not in contact with the remainder of the dielectric cap.

19. The method of claim 15, wherein etching the first dielectric layer and the second dielectric layer also etches the dielectric cap.

20. The method of claim 15, wherein the first dielectric layer and the dielectric cap are made of a same material.

* * * * *